(12) United States Patent
Lê et al.

(10) Patent No.: US 11,619,919 B2
(45) Date of Patent: Apr. 4, 2023

(54) CIRCUIT ARRANGEMENT FOR SWITCHING AN ELECTRICAL LOAD AND METHOD FOR CHECKING A STATUS OF A SAFETY OUTPUT OF A CIRCUIT ARRANGEMENT

(71) Applicant: Pilz GmbH & Co. KG, Ostfildern (DE)

(72) Inventors: Kim Lê, Ostfildern (DE); Paul Depner, Ostfildern (DE); Ralf Bauer, Ostfildern (DE); Stefan Röhmann, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 912 days.

(21) Appl. No.: 16/445,471

(22) Filed: Jun. 19, 2019

(65) Prior Publication Data
US 2019/0391549 A1 Dec. 26, 2019

(30) Foreign Application Priority Data
Jun. 20, 2018 (DE) .......................... 102018114781.3

(51) Int. Cl.
*G01R 31/327* (2006.01)
*H01H 47/22* (2006.01)
(Continued)

(52) U.S. Cl.
CPC ..... *G05B 19/0425* (2013.01); *G01R 31/3277* (2013.01); *H01H 13/18* (2013.01);
(Continued)

(58) Field of Classification Search
CPC ...... G01R 31/3277; G05B 9/03; H01H 47/22; H01H 47/005; H01H 47/002
See application file for complete search history.

(56) References Cited

FOREIGN PATENT DOCUMENTS

| CN | 102570377 A | * | 7/2012 |
| CN | 106851920 A | * | 6/2017 |

(Continued)

OTHER PUBLICATIONS

English translation of "DE102015104211", Pullmann, Safety Switching Device For Fail-safe Disconnection Of An Electrical Load, Sep. 22, 2016 (Year: 2016).*

(Continued)

*Primary Examiner* — Sisay G Tiku
(74) *Attorney, Agent, or Firm* — Edell, Shapiro & Finnan, LLC

(57) ABSTRACT

A circuit arrangement for switching an electrical load comprising an electrical switching element with a control input and an output; a control unit connected to the control input to drive the electrical switching element, in a first switching state, to generate a first output signal forming a switch-on signal for the load and, in a second switching state, to generate a second output signal, smaller than the first output signal, forming a switch-off signal for the electrical load; a safety output connected electrically to the electrical switching element output and to which the electrical load is connected; a decoupling apparatus arranged between the electrical switching element output and the safety output; a first output signal detecting apparatus connected to the electrical switching element output; and a second output signal detecting apparatus arranged in a circuit path between the decoupling apparatus and the safety output.

12 Claims, 1 Drawing Sheet

(51) Int. Cl.
*H01H 47/00* (2006.01)
*G05B 9/03* (2006.01)
*G05B 19/042* (2006.01)
*H01H 13/18* (2006.01)

(52) U.S. Cl.
CPC ............ *G05B 2219/21152* (2013.01); *G05B 2219/21168* (2013.01)

(56) References Cited

FOREIGN PATENT DOCUMENTS

| | | | | |
|---|---|---|---|---|
| DE | 10127233 C1 | 11/2002 | | |
| DE | 102005048601 B3 | * 4/2007 | ............... | G01D 3/08 |
| DE | 102005062259 A1 | * 7/2007 | ............. | H03K 17/94 |
| DE | 102009007955 A1 | 8/2010 | | |
| DE | 102012103015 A1 | * 10/2013 | ........... | H01H 47/004 |
| DE | 102012010144 B3 | 11/2013 | | |
| DE | 102015104211 A1 | 9/2016 | | |
| DE | 102020128430 A1 | * 6/2021 | ....... | H04L 12/40013 |
| EP | 1594024 A1 | 11/2005 | | |
| KR | 20160140435 A | * 12/2016 | | |
| WO | WO-2007039017 A1 | * 4/2007 | ............... | G01D 3/08 |
| WO | WO-2017102025 A1 | * 6/2017 | ......... | G01R 31/3278 |

OTHER PUBLICATIONS

Search report in corresponding European Patent Application No. 19175692.3, dated Nov. 11, 2019, with English translation.
Wikipedia, "Transistor", English translation, https://de.wikipedia.org/w/index.php?title=Transistor&oldid=226930129, 15 pages.

* cited by examiner

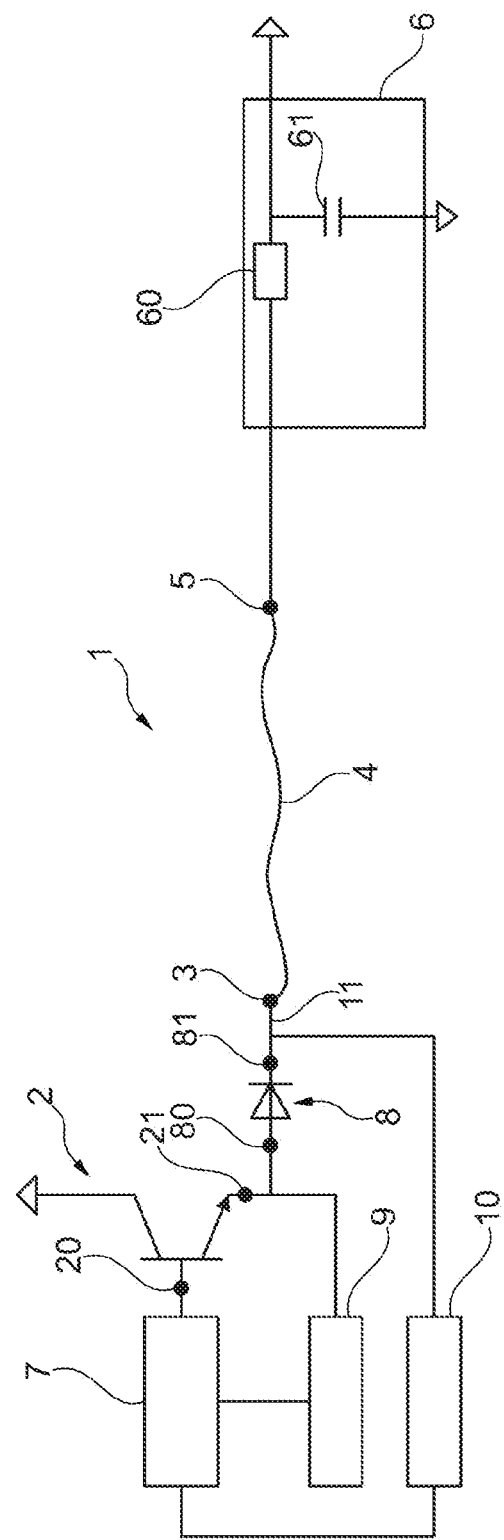

CIRCUIT ARRANGEMENT FOR SWITCHING AN ELECTRICAL LOAD AND METHOD FOR CHECKING A STATUS OF A SAFETY OUTPUT OF A CIRCUIT ARRANGEMENT

CROSS REFERENCE TO RELATED APPLICATIONS

This application claims foreign priority under 35 U.S.C. § 119(a)-(d) to Application No. DE 102018114781.3 filed on Jun. 20, 2018, the entire contents of which are hereby incorporated by reference.

TECHNICAL FIELD

The present disclosure relates to a circuit arrangement for switching an electrical load, the circuit arrangement comprising at least one electrical switching element with a control input and an output; a control unit, which is connected to the control input, wherein the control unit is configured so as to drive the electrical switching element such that in a first switching state of the electrical switching element a first output signal, which forms, in particular, a switch-on signal for the load, can be generated at the output, and in a second switching state a second output signal, which is smaller than the first output signal in terms of amount and forms, in particular, a switch-off signal for the electrical load, can be generated; at least one safety output, which is connected electrically to the output of the electrical switching element and to which the electrical load can be connected; a decoupling apparatus, which is arranged between the output of the electrical switching element and the safety output; as well as a first output signal detecting apparatus, which is connected to the output of the electrical switching element.

BACKGROUND

Circuit arrangements for switching an external electrical load are known from the prior art. Examples thereof can be seen in DE 10 2012 111 070 A1 and DE 10 2007 002 953 A1. Such circuit arrangements are used, in particular, as output circuits in devices that are used in safety and automation technology in order to enable a dangerous technical system or machine to be safely switched off in the event of potentially hazardous situations or alternatively to prevent the technical system or machine from being switched on. These devices, which can be used, in particular, in safety and automation technology, may be, for example, event signaling devices or sensors of various types, with the assistance of which hazardous areas of a machine or a technical system may be monitored. Event signaling devices or, more specifically, sensors may be, for example, emergency OFF push buttons, emergency STOP push buttons, safety doors, safety shutdown mats, two hand switches, light grids, end position switches and other position switches. These event signaling devices or, more specifically, sensors form from a functional point of view signal generators, which are capable of generating binary output signals, which can be transmitted by a safety output of the circuit arrangement to an external load, for example, to a safety relay, a contactor or a control apparatus, in particular, a safety control apparatus, so that a safe switching on and off of the technical system or machine can be made possible.

These binary output signals, which form the switching signals for the load, typically have two defined states that can be defined, for example, by two static potentials. In this case, the binary states include two different voltage states, wherein a first state is adopted when a defined voltage threshold value is reached or exceeded. In this case, it is a so-called high level state. A second state is adopted when a defined voltage threshold value is reached or undershot. In this case, it is a so-called low level state. These binary switching states indicate, for example, whether a person or an object is or is not in a hazardous area to be monitored or whether an event signaling device, for example, an emergency OFF switch or alternatively an emergency stop switch has been activated.

When a generic circuit arrangement is used, for example, as an output circuit in safety-oriented applications, it is necessary to check periodically the switching ability, in particular, the switching off ability, of the electrical switching element. Thus, in the running mode of the machine or technical system, a switch-off pulse is generated by the electrical switching element; and the length of time of the switch-off pulse is chosen (i.e., selected) to be so short that this short term switch-off has no influence whatsoever on the electrical load connected to the safety output of the circuit arrangement. Such a test is also often referred to as a dark test. Such a dark test has to distinguish the operational and, thus, intentional switching off of the load.

It has been shown that, in particular, when the load, connected to the circuit arrangement, and the connecting wiring exhibit a capacitive characteristic, the length of time of the dark test cannot be chosen (i.e., selected) so as to be infinitely short without causing thereby an undesired switching off of the load. If the switch-off pulse cannot be filtered out, for example, by a low pass filter element of a load-sided input, which is connected to the safety output of the circuit arrangement, then a distinction between a dark test and an operational and, thus, intentional switching off of the load, in particular, in a potentially hazardous situation cannot be made. However, the load does not have to be necessarily of a capacitive nature, but rather can also have, for example, an inductive character. The decisive factor is that the load does not respond immediately to a change in the switching state of the electrical switching element and, as a result, has a low pass characteristic.

If, moreover, a decoupling apparatus, which is designed to prevent a current flow from the load to an electrical switching element, in particular, during the execution of a dark test, is integrated into the circuit arrangement, then there is the problem that shorts, in particular, cross circuits to an electric supply voltage of the circuit arrangement, can no longer be detected as such during an operational switching off of the load. The result is a decrease in the degree of the diagnostic coverage.

SUMMARY

The object of the present disclosure is to provide a circuit arrangement of the kind mentioned in the introductory part that can reliably detect electrical shorts, in particular, cross circuits to an electrical supply voltage, during an operational switching off of the load.

An example implementation of a circuit arrangement for switching an electrical load comprises a second output signal detecting apparatus that is arranged in a circuit path between the decoupling apparatus and the safety output. Thus, the circuit arrangement comprises, in addition to the first output signal detecting apparatus, by which the output signal, emitted by the switching element, of the electrical switching element can be detected in front of the decoupling apparatus, a second output signal detecting apparatus, by which the output signal, emitted by the switching element, can, moreover, also be detected in the circuit path behind the decoupling apparatus. Thus, the output signal of the switching element can be detected in front of and behind the decoupling apparatus via the two output signal detecting apparatuses and can be read back. As a result, it is possible in an advantageous way to detect the status of the safety output and, thus, also possible cross circuits, in particular, cross circuits in the connecting wiring of the external load, to an electrical supply voltage (for example, a supply voltage 24 V DC) during an operational (that is, an intentional) switching off. The result is an effective increase in the degree of the diagnostic coverage. If the safety output is switched off in the normal operating mode and, thus, intentionally, the result is an evaluation by the first output signal detecting apparatus and the second output signal detecting apparatus. If the signals, which are detected by the two output signal detecting apparatuses, are not identical, then the fault can be recognized and defined accordingly.

In a preferred example implementation, it is proposed that the control unit be configured to switch the electrical switching element from the first switching state into the second switching state and from the second switching state back into the first switching state for a predetermined or predeterminable duration of the test in a test mode for testing the switching ability of the electrical switching element. This feature offers the option of carrying out a dark test of the circuit arrangement using the control unit and the first output signal detecting apparatus, in order to check the switching ability of the electrical switching element of the circuit arrangement. In this case, the length of the test is chosen (i.e., selected) such that the operation of the external load is not adversely effected when the test is being conducted. Thus, when the dark test is carried out, the electrical switching element is briefly switched off in the manner described above and without disturbing the operation of the load. The switch-off status of the electrical switching element is evaluated only by the first output signal detecting apparatus. In contrast, the second output signal detecting apparatus is not used for the evaluation, since owing to the low pass character of the electrical load the status of the second output signal detecting apparatus changes only slowly due to the switching off.

In a particularly preferred example implementation, it is proposed that the decoupling apparatus be designed to suppress a current flow from the safety output to the electrical switching element. The decoupling apparatus of the circuit arrangement can effectively prevent in an advantageous way that the external electrical load and the capacitor of the connecting wiring have to be discharged during the execution of a dark test.

In an advantageous example implementation, it can be provided that the decoupling apparatus is designed as a semiconductor element. Thus, it is possible to obtain, in particular, a robust and functionally safe configuration of the decoupling apparatus. In a particularly advantageous example implementation, there is the option that the semiconductor element is a diode that can be operated in the conducting direction between the output of the switching element and the safety output.

The electrical switching element can be designed preferably as a transistor, in particular, as a bipolar transistor or as a field effect transistor. As a result, a robust configuration of the electrical switching element is provided.

In a preferred example implementation, it is proposed that the first output signal detecting apparatus is connected to the control unit. By using the control unit, it is possible to process and evaluate the output signals of the electrical switching element that are detected by the first output signal detecting apparatus in front of the decoupling apparatus.

In a particularly preferred example implementation, it can be provided that the second output signal detecting apparatus is connected to the control unit. By using the control unit, it is possible to process and evaluate the output signals of the electrical switching element that are detected by the second output signal detecting apparatus behind the decoupling apparatus. When a test is conducted during an operational switching off of the safety output, the control unit checks whether both output signal detecting apparatuses send back the same status. If the measurement results of both output signal detecting apparatuses are not identical, then the fault can be narrowed down more easily. It can be distinguished, in particular, whether the electrical switching element has a defect or whether there is a cross circuit to a connecting lead by which the safety output of the circuit arrangement is connected to the electrical load.

According to another aspect, the present disclosure relates to a method for checking a status of a safety output of a circuit arrangement for switching an electrical load that is connected to the safety output, wherein an electrical switching element, which is connected electrically to the safety output, generates a first output signal, which forms, in particular, a switch-on signal for the load, in a first switching state and generates in a second switching state a second output signal, which is smaller than the first output signal in terms of amount and forms, in particular, a switch-off signal for the electrical load.

An additional object of the present disclosure consists of providing a method of the type that is mentioned in the introductory part and that is intended for checking a status of a safety output of a circuit arrangement for switching an electrical load that is connected to the safety output, in which method the status of the safety output can be reliably detected in the event of electrical shorts, in particular, in the event of cross circuits to an electrical supply voltage, during an operational switching off of the safety output.

A method in accordance with the example implementation includes the feature that a first signal between the electrical switching element and a decoupling apparatus is detected by a first output signal detecting apparatus; and a second signal between the decoupling apparatus and the safety output is detected by a second output signal detecting apparatus; and the two signals are compared with one another. The method of the example implementation makes it possible to check in a reliable way the status of the safety output of the circuit arrangement during an operational switching on and an operational switching off of the safety output. For example, it can be checked during an operational switching off of the safety output whether both output signal detecting apparatuses send back the same signals and, thus, the same status of the safety output. If the results of both output signal detecting apparatuses are not identical, then the fault can be narrowed down accordingly. It can be distinguished, in particular, whether the electrical switching element has a defect or whether there is a cross circuit to the connecting lead by which the safety output of the circuit arrangement is connected to the electrical load.

In order to be able to determine the switching ability of the electrical switching element in the context of a dark test, it is proposed in a particularly advantageous example implementation that during the duration of the test the electrical switching element is switched briefly from the first switching state into the second switching state and then from the second switching state back again into the first switching state, wherein the length of the test is chosen (i.e., selected) such that the operation of the electrical load is not influenced and during the duration of the test the output signals of the switching element are detected by the first output signal detecting apparatus.

BRIEF DESCRIPTION OF THE DRAWINGS

Other features and advantages of the described circuit arrangement and method will become apparent from the following description of a preferred example implementation with reference to the accompanying sole drawing FIGURE, which shows a circuit arrangement for switching an external electrical load.

DETAILED DESCRIPTION

The circuit arrangement 1, which is designed as a single channel system in this example implementation comprises an electrical switching element 2 having a control input 20 and an output 21 and being designed as a bipolar transistor in the example implementation. In this case, the bipolar transistor is designed as an NPN transistor. Furthermore, the circuit arrangement 1 comprises a safety output 3, by which the circuit arrangement 1 can emit an output signal for switching the electrical load 6. In principle, the circuit arrangement 1 can also be designed as a multi-channel system and, as a result, can comprise a plurality of safety outputs 3, each of which is able to emit an output signal.

The circuit arrangement 1 can be used, for example, in safety and automation technology and can be designed to safely switch the electrical load 6, connected thereto. The circuit arrangement 1 may be, in particular, part of a device, which can be used in safety and automation technology, preferably an event signaling device or a sensor, by which, for example, hazardous areas of a machine or technical system can be monitored. In this case, the goal is to safely switch off the electrical load 6 in a hazardous situation. The event signal device may be, for example, an emergency OFF push button, which serves to safely switch off the machine or technical system in the event of a hazardous situation.

The at least one safety output 3 of the circuit arrangement 1 is connected to an input 5 of the load 6 by a connecting lead 4, so that when the circuit arrangement is in operation, the circuit arrangement 1 can emit output signals, which can be transmitted over the connecting lead 4 to the electrical load 6 and can trigger corresponding switching events. The electrical load 6 may be, for example, a relay, a contactor, a control apparatus, in particular, a safety control apparatus, a technical system or a machine. In the example implementation shown herein, the load is a capacitive electrical load 6, which has been depicted in a simplified way in the drawing FIGURE by an equivalent circuit diagram with one resistor 60 and one capacitor 61. The resistor 60 and the capacitor 61 may also be real structural components of the load 6 that form a low pass filter element from a functional view. For example, the capacitive load 6 may be an input of a control apparatus, in particular, a programmable logic control apparatus. Preferably the control apparatus may be a safety control apparatus for safety-oriented applications. If the electrical load 6, connected to the circuit arrangement 1, comprises at least one relay or one contactor, then the load may also exhibit inductive load properties.

In order to ensure that the electrical load 6, connected to the circuit arrangement 1, can be safely switched, the safety output 3 is periodically switched off in the running mode of the load 6, in order to check the switching-off ability of the electrical switching element 2 of the circuit arrangement 1. This checking is also often referred to as the "dark test." In such a dark test, a short switch-off pulse is generated; and the length of time of the switch-off pulse is chosen so short that an influence on the electrical load 6 can be avoided. In other words, the operation of the electrical load 6 is not interrupted by the switch-off pulse while the dark test is being conducted.

Furthermore, the circuit arrangement 1 comprises a control unit 7, which is connected to the control input 20 of the electrical switching element 2. By using the control unit 7, the switching element 2 can be driven such that in a first switching state a first output signal, which forms a switch-on signal for the electrical load 6, is generated at the output 21. In a second switching state, a second output signal, which is smaller than the first output signal in terms of amount and forms a switch-off signal for the electrical load 6, is generated at the output 21. These output signals may be, in particular, binary switching signals, which have two defined states that can be defined, for example, by two static potentials. In this case, the binary states include two different voltage states, wherein a first state is adopted when a defined voltage threshold value is reached or exceeded. In this case, it is a so-called high level state. A second state is adopted when a defined voltage threshold value is reached or undershot. In this case, it is a so-called low level state. These binary switching states indicate, for example, whether a person or an object is or is not in a hazardous area to be monitored or whether an event signaling device, for example, an emergency OFF switch or alternatively an emergency stop switch has been activated.

For the purpose of conducting a dark test to check the switching ability of the electrical switching element 2, the switching element is switched briefly by the control unit 7 from the first switching state (switch-on state) into the second switching state (switch-off state) in a testing mode and then is switched from the second switching state back again into the first switching state. In this way a short term switch-off pulse is generated that does not influence the operation of the electrical load 6.

Furthermore, the circuit arrangement 1 comprises a first output signal detecting apparatus 9 that is connected to the output 21 of the electrical switching element 2. The first output signal detecting apparatus 9 is configured to detect the output signal of the switching element 2. The first output signal detecting apparatus 9 is connected preferably to the control unit 7 of the circuit arrangement 1. As a result of the detection and processing of the output signal of the switching element 2, where the output signal is detected by the first output signal detecting apparatus 9 and where the detection and processing take place, in particular, by the control unit 7, it is possible to deduce the switching state of the switching element and, thus, also the status of the safety output 3 of the circuit arrangement 1. In other words, it can be checked whether a switch-on signal or a switch-off signal is pending at the safety output 3. In particular, the switch-off pulse, generated during the dark test, can be detected by the first output signal detecting apparatus 9, so that the switch-off ability of the switching element 2 can be checked.

Owing to the capacitive character of the electrical load 6, connected to the circuit arrangement 1, in the example implementation, the length of time of the switch-off pulse cannot be chosen (i.e., selected) infinitely short while the dark test is being conducted. The capacitive load 6, shown by the resistor 60 and the capacitor 61 as a substitute in the drawing FIGURE, forms from a functional view a low pass filter element, which under some circumstances is not able to filter out the short term switch-off signal when the dark test is being conducted, so that the dark test has a direct impact on the electrical load 6. Consequently, no distinction can be made between the execution of the dark test and an operational (that is, an intentional) switching off of the load 6. It should be mentioned at this point that the load 6 does not have to be necessarily of a capacitive nature, but rather may also have an inductive character. The decisive factor is that the load 6 does not respond immediately to a change in the switching state of the switching element 2 and, thus, has a low pass characteristic.

In order to remedy the aforementioned problem, a decoupling apparatus 8, which comprises an input 80 and an output 81, is arranged between the output 21 of the electrical switching element 2 and the safety output 3 of the circuit arrangement 1. In the example implementation shown here, the decoupling apparatus 8 is designed as a diode that is switched into the conducting direction. The input 80 of the decoupling apparatus 8 is connected to the output 21 of the electrical switching element 2. Furthermore, the output 81 of the decoupling apparatus 8 is connected to the safety output 3 of the circuit arrangement 1.

The decoupling apparatus 8, which is designed as a diode in the example implementation, prevents the load 6, connected to the circuit arrangement 1, and the capacitor of the connecting lead 4 from having to be discharged when the dark test is being conducted. In other words, the decoupling apparatus 8, which is designed as a diode switched into the conducting direction in the example implementation, prevents an electric current from flowing from the electrical load 6 back to the electrical switching element 2.

However, there is the problem in this case that electrical shorts, for example, cross circuits to an electrical supply voltage (for example, 24 V DC) of the circuit arrangement 1, cannot be detected in that part of the circuit arrangement 1 between the decoupling apparatus 8, in particular, the output 81 of the decoupling apparatus 8, and the safety output 3 during an operational and, thus, intentional switching off of the switching element 2.

Nevertheless, in order to be able to detect such electrical shorts, the circuit arrangement 1 comprises, in addition to the first output signal detecting apparatus 9, a second output signal detecting apparatus 10. The second output signal detecting apparatus 10 is connected to the circuit path 11 between the output 81 of the decoupling apparatus 8 and the safety output 3. As a result, it is achieved that the second output signal detecting apparatus 10 can detect the status of the switching element 2 and, thus, of the safety output 3 in the circuit path 11 behind the decoupling apparatus 8, i.e., between the output 81 of the decoupling apparatus 8 and the safety output 3. The second output signal detecting apparatus 10 is also connected preferably to the control unit 7 of the circuit arrangement 1. As a result of the detection and processing of the output signal of the switching element 2, where the output signal is detected by the second output signal detecting apparatus 10 and where the detection and processing take place, in particular, by the control unit 7, it is possible to deduce the switching state of the switching element and, thus, also the status of the safety output 3 of the circuit arrangement 1.

Thus, the status of the circuit arrangement 1 can be detected in front of and behind the decoupling apparatus 8 by using the first output signal detecting apparatus 9 and the second output signal detecting apparatus 10 and can be read back. As a result, it is possible in an advantageous way to detect a cross circuit to the operating voltage of the circuit arrangement 1 during an operational switching off of the electrical load 6. In principle, a cross circuit of the connecting lead 4 to both a reference potential (LOW) and also to a higher potential (HIGH), such as, for example, the operating voltage, can occur. A cross circuit to the reference potential (LOW) can be recognized during an operational switching on. A cross circuit to the higher potential (HIGH), as such, for example, the operating voltage, can be detected during an operational switching off.

When a test is conducted during an operational switching off of the safety output 3, the control unit 7 checks whether both output signal detecting apparatuses 9, 10 are measuring the same signals and, thus, send back the same status. If the signals of the two output signal detecting apparatuses 9, 10 are not identical, then the fault can be better defined. It is possible to distinguish, in particular, whether the electrical switching element 2 has a defect or whether there is a cross circuit to the electrical connecting lead 4 by which the safety output 3 of the circuit arrangement 1 is connected to the electrical load 6.

When a dark test is being conducted, the electrical switching element 2 is switched off briefly in the manner described above and without disturbing the operation of the load 6. The switching-off status of the electrical switching element 2 is evaluated only by the first output signal detecting apparatus 9. The second output signal detecting apparatus 10 is not used for the evaluation when a dark test is being conducted, since owing to the low pass character of the electrical load 6 the status of the second output signal detecting apparatus 10 changes only slowly.

What is claimed is:

1. A circuit arrangement for switching an electrical load, the circuit arrangement comprising:
    an electrical switching element with a control input and an output;
    a control unit connected to the control input of the electrical switching element to switch an output signal for the electrical load at the output of the electrical switching element from a switch-on state to a switch-off state and from the switch-off state to the switch-on state during a test mode for testing a switching capability of the electrical switching element, wherein a duration of the switch-off state is selected such that operation of the electrical load is not influenced during the test mode, the output signal being smaller in the switch-off state than in the switch-on state;
    a safety output connected electrically to the output of the electrical switching element and to which the electrical load is connected;
    a decoupling apparatus arranged between the output of the electrical switching element and the safety output;
    a first output signal detecting apparatus connected to the output of the electrical switching element to detect the output signal of the electrical switching element in front of the decoupling apparatus; and
    a second output signal detecting apparatus arranged in a circuit path between the decoupling apparatus and the safety output to detect the output signal of the electrical switching element behind the decoupling apparatus, the circuit arrangement being configured to compare the output signals of the electrical switching element in front of and behind the decoupling apparatus to detect electrical shorts.

2. The circuit arrangement of claim 1, wherein the decoupling apparatus suppresses a current flow from the safety output to the electrical switching element.

3. The circuit arrangement of claim 1, wherein the decoupling apparatus comprises a semiconductor element.

4. The circuit arrangement of claim 3, wherein the semiconductor element is a diode operable in a conducting direction between the output of the electrical switching element and the safety output.

5. The circuit arrangement of claim 1, wherein the electrical switching element comprises a transistor.

6. The circuit arrangement of claim 5, wherein the transistor comprises a bipolar transistor.

7. The circuit arrangement of claim 5, wherein the transistor comprises a field effect transistor.

8. The circuit arrangement of claim 1, wherein the first output signal detecting apparatus is connected to the control unit.

9. The circuit arrangement of claim 1, wherein the second output signal detecting apparatus is connected to the control unit.

10. The circuit arrangement of claim 1, wherein comparison of the output signals of the electrical switching element in front of and behind the decoupling apparatus enables the circuit arrangement to distinguish between electrical shorts and defects in the electrical switching element.

11. A method for checking a status of a safety output of a circuit arrangement for switching an electrical load connected to the safety output, comprising:

electrically connecting an electrical switching element to the safety output;

switching an output signal of the electrical switching element for the electrical load from a switch-on state to a switch-off state and from the switch-off state to the switch-on state during a test mode for testing a switching capability of the electrical switching element, wherein a duration of the switch-off state is selected such that operation of the electrical load is not influenced during the test mode, the output signal being smaller in the switch-off state than in the switch-on state detecting, by a first output signal detecting apparatus, a first signal between the electrical switching element and a decoupling apparatus, the first signal being the output signal of the electrical detected in front of the decoupling apparatus;

detecting, by a second output signal detecting apparatus, a second signal between the decoupling apparatus and the safety output, the second signal being the output signal of the electrical detected behind the decoupling apparatus; and comparing the first and second signals with one another to detect electrical shorts.

12. The method of claim 11, wherein comparing the first and second signals enables distinguishing between electrical shorts and defects in the electrical switching element.

* * * * *